(12) United States Patent
Ogasawara et al.

(10) Patent No.: US 7,651,789 B2
(45) Date of Patent: Jan. 26, 2010

(54) ORGANIC ELECTROLUMINESCENT DEVICE

(75) Inventors: Jun Ogasawara, Minami-Ashigara (JP); Masayuki Mishima, Minami-Ashigara (JP)

(73) Assignee: Fujifilm Corporation, Kanagawa (JP)

( * ) Notice: Subject to any disclaimer, the term of this patent is extended or adjusted under 35 U.S.C. 154(b) by 507 days.

(21) Appl. No.: 11/060,768

(22) Filed: Feb. 18, 2005

(65) Prior Publication Data

US 2005/0202275 A1    Sep. 15, 2005

(30) Foreign Application Priority Data

Mar. 10, 2004 (JP) ............ P. 2004-066780

(51) Int. Cl.
*H01L 51/54* (2006.01)
*C09K 11/06* (2006.01)

(52) U.S. Cl. ............ 428/690; 257/40; 257/E51.026; 257/E51.047; 257/E51.049; 313/504; 313/506; 428/917

(58) Field of Classification Search ............ None
See application file for complete search history.

(56) References Cited

U.S. PATENT DOCUMENTS

| | | | | |
|---|---|---|---|---|
| 6,660,410 B2 * | 12/2003 | Hosokawa | ............ | 428/690 |
| 6,670,054 B1 * | 12/2003 | Hu et al. | ............ | 428/690 |
| 6,803,720 B2 * | 10/2004 | Kwong et al. | ............ | 313/504 |
| 7,232,619 B2 * | 6/2007 | Nomura et al. | ............ | 428/690 |
| 7,318,965 B2 * | 1/2008 | Fujita et al. | ............ | 428/690 |
| 2002/0028329 A1 * | 3/2002 | Ise et al. | ............ | 428/336 |
| 2003/0027016 A1 * | 2/2003 | Ara et al. | ............ | 428/690 |
| 2003/0039858 A1 * | 2/2003 | Igarashi et al. | ............ | 428/690 |
| 2004/0086745 A1 * | 5/2004 | Iwakuma et al. | ............ | 428/690 |
| 2005/0037232 A1 * | 2/2005 | Tyan et al. | ............ | 428/690 |
| 2005/0084711 A1 * | 4/2005 | Sasaki et al. | ............ | 428/690 |
| 2005/0158578 A1 * | 7/2005 | Iwakuma et al. | ............ | 428/690 |
| 2005/0202278 A1 | 9/2005 | Mishima et al. | | |
| 2006/0063027 A1 * | 3/2006 | Vestweber et al. | ............ | 428/690 |
| 2006/0159951 A1 | 7/2006 | Falcou et al. | | |

FOREIGN PATENT DOCUMENTS

| | | | |
|---|---|---|---|
| JP | 2000-344691 A | | 12/2000 |
| JP | 2001-196183 A | | 7/2001 |
| JP | 2003-206278 A | | 7/2003 |
| JP | 2003286260 A | * | 10/2003 |
| JP | 2005-126431 A | | 5/2005 |
| JP | 2005-220080 A | | 8/2005 |
| JP | 2005-294250 A | | 10/2005 |
| JP | 2006-528836 A | | 12/2006 |
| WO | WO 2004/058911 | * | 7/2004 |
| WO | WO-2005/011334 A1 | | 2/2005 |

OTHER PUBLICATIONS

Xie et al., Synthetic Metals, (2000), vol. 108, pp. 81-84.*
Totani et al., JP 2003-286260, Machine Translation.*
Brutting, Physics of Organic Semiconductors, p. 485, downloaded from the internet, Oct. 13, 2008.*
Japanese Office Action issued Apr. 15, 2009 with English Translation.

* cited by examiner

*Primary Examiner*—D. Lawrence Tarazano
*Assistant Examiner*—Brett A Crouse
(74) *Attorney, Agent, or Firm*—Birch, Stewart, Kolasch & Birch, LLP

(57) ABSTRACT

To provide an organic electroluminescent device which suppresses crystallization of a material to be used in an organic electroluminescent device and which is good in luminous characteristics, device drive durability and storage stability, the organic electroluminescent device has at least one organic layer including a light emitting layer between a pair of electrodes, wherein the light emitting layer contains a compound represented by formula (1) defined in the specification and a light emitting material.

9 Claims, No Drawings

ORGANIC ELECTROLUMINESCENT DEVICE

FIELD OF THE INVENTION

The present invention relates to an organic electroluminescent device capable of converting electric energy into light, thereby undergoing light emission.

BACKGROUND OF THE INVENTION

As one of large causes to deteriorate the durability of an organic electroluminescent device (hereinafter sometimes referred to as "light emitting device" or "organic EL device"), there is enumerated a problem of crystallization of an organic material. If the crystallinity of an organic material to be used in the device is high, the organic material in the device causes crystallization due to the storage over a long period of time or the generation of heat in driving the device, resulting in a problem of causing device breakage such as short circuit of the device.

JP-A-2001-196183 describes an organic electroluminescent device containing a compound which is included in a compound represented by formula (1) of the invention as described later. However, this document neither describes nor suggests that a phosphorescent material is used as a light emitting material and that a compound represented by formula (1) is used as a host material (combined use with other light emitting material). Further, this document neither describes nor suggests that L in formula (1) of the invention is a trivalent or polyvalent aromatic hydrocarbon group, a trivalent or polyvalent aromatic heterocyclic group, a trivalent or polyvalent thiophene structure-containing group, or a trivalent or polyvalent carbazole structure-containing group.

SUMMARY OF THE INVENTION

An object of the invention is to provide an organic electroluminescent device which suppresses crystallization of a material to be used in an organic EL device and which is good in luminous characteristics, device drive durability and storage stability.

In order to find a method of effectively reducing crystallization of a material to be used in an organic EL device, the present inventors made extensive and intensive investigations. As a result, it has been found that by making a compound represented by formula (1) present in a light emitting layer, the problem of crystallization of a light emitting material is improved, and the device durability of a device as prepared using this is largely improved.

In addition, it has been found that by containing a compound capable of injecting or transporting a hole or a compound capable of injecting or transporting an electron in the light emitting layer of the light emitting device, the durability is further enhanced.

That is, according to the invention, organic electroluminescent devices having the following constructions are provided, whereby the foregoing object of the invention is achieved.

(1) An organic electroluminescent device comprising:
a pair of electrodes; and
at least one organic layer between the pair of electrodes, the at least one organic layer including a light emitting layer,
wherein the light emitting layer comprises: a compound represented by formula (1); and a light emitting material:

$$L—(Ar^1)_m \quad \text{Formula (1)}$$

wherein $Ar^1$s each independently represents a group represented by formula (2); L represents a trivalent or polyvalent connecting group; and m represents an integer of 3 or more:

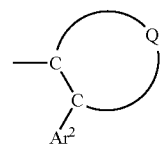

Formula (2)

wherein Q represents a residue for forming an aryl ring or a heteroaryl ring; and $Ar^2$ represents an aryl group or a heteroaryl group.

(2) The organic electroluminescent device as set forth above in (1), wherein the group represented by formula (2) is a group represented by formula (3):

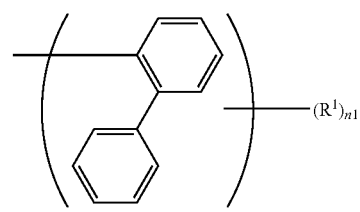

Formula (3)

wherein $R^1$ represents a substituent; n1 represents an integer of from 0 to 9; and when n1 is 2 or more, $R^1$s are the same or different.

(3) The organic electroluminescent device as set forth above in (2), wherein $R^1$ represents an alkyl group, an aryl group, or a heteroaryl group.

(4) The organic electroluminescent device as set forth above in any one of (1) to (3), wherein L in formula (1) represents a trivalent or polyvalent aromatic hydrocarbon group, a trivalent or polyvalent aromatic heterocyclic group, a trivalent or polyvalent group containing a thiophene structure, or a trivalent or polyvalent group containing a carbazole structure.

(5) The organic electroluminescent device as set forth above in any one of (1) to (4), wherein the light emitting material comprises a phosphorescent material.

(6) The organic electroluminescent device as set forth above in (5), wherein the phosphorescent material is a transition metal complex.

(7) The organic electroluminescent device as set forth above in any one of (1) to (6), wherein the light emitting layer further comprises a compound capable of at least one of injecting and transporting a hole.

(8) The organic electroluminescent device as set forth above in (7), wherein the compound capable of at least one of injecting and transporting the hole has an ionization potential of from 5.0 to 6.1 eV.

(9) The organic electroluminescent device as set forth above in any one of (1) to (6), wherein the light emitting layer further comprises a compound capable of at least one of injecting and transporting an electron.

(10) The organic electroluminescent device as set forth above in (9), wherein the compound capable of at least one of injecting and transporting the electron has an electron affinity of from 2.0 to 3.5 eV.

(11) The organic electroluminescent device as set forth above in (9) or (10), wherein the compound capable of at least one of injecting and transporting the electron is a metal complex or a heterocyclic compound containing at least two nitrogen atoms.

The organic electroluminescent device of the invention is excellent in luminous characteristics, device drive durability and storage stability.

DETAILED DESCRIPTION OF THE INVENTION

The organic electroluminescent device of the invention is an organic electroluminescent device comprising at least one organic layer including a light emitting layer between a pair of electrodes, wherein the light emitting layer comprises a compound represented by formula (1) and a light emitting material.

         Formula (1)

In formula (1), $Ar^1$s each independently represents a group represented by formula (2); L represents a trivalent or polyvalent connecting group; and m represents an integer of 3 or more.

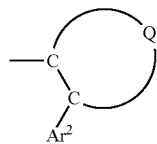
         Formula (2)

In formula (2), Q represents a residue for forming an aryl ring or a heteroaryl ring; and $Ar^2$ represents an aryl group or a heteroaryl group.

Formula (1) will be described below in detail.

L in formula (1) represents a trivalent or polyvalent connecting group. However, the case where L represents the following connecting group is excluded preferably.

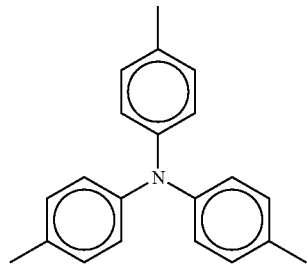

The connecting group represented by L is a connecting group comprising at least one atom of B, C, N, O, Si, P, S and Ge; more preferably a trivalent or polyvalent group containing an aromatic hydrocarbon ring, a trivalent or polyvalent group containing an aromatic heterocyclic ring, a trivalent or polyvalent group containing a thiophene structure, or a trivalent or polyvalent group containing a carbazole structure; and most preferably a trivalent or polyvalent aromatic hydrocarbon group, a trivalent or polyvalent heterocyclic group, a trivalent or polyvalent group containing a thiophene structure, or a trivalent or polyvalent group a carbazole structure.

The connecting group represented by L may have a substituent. Examples of the substituent include an alkyl group (preferably one having from 1 to 30 carbon atoms, more preferably one having from 1 to 20 carbon atoms, and especially preferably one having from 1 to 10 carbon atoms). The substituent can be chosen among the following substituent group A including an alkyl group.

(Substituent Group A)

An alkyl group (preferably one having from 1 to 30 carbon atoms, more preferably one having from 1 to 20 carbon atoms, and especially preferably one having from 1 to 10; for example, methyl, ethyl, isopropyl, tert-butyl, n-octyl, n-decyl, n-hexadecyl, cyclopropyl, cyclopentyl, and cyclohexyl), an alkenyl group (preferably one having from 2 to 30 carbon atoms, more preferably one having from 2 to 20 carbon atoms, and especially preferably one having from 2 to 10 carbon atoms; for example, vinyl, allyl, 2-butenyl, and 3-pentenyl), an alkynyl group (preferably one having from 2 to 30 carbon atoms, more preferably one having from 2 to 20 carbon atoms, and especially preferably one having from 2 to 10 carbon atoms; for example, propargyl and 3-pentynyl), an aryl group (preferably one having from 6 to 30 carbon atoms, more preferably one having from 6 to 20 carbon atoms, and especially preferably one having from 6 to 12 carbon atoms; for example, phenyl, p-methylphenyl, naphthyl, and anthranyl), an amino group (preferably one having from 0 to 30 carbon atoms, more preferably one having from 0 to 20 carbon atoms, and especially preferably one having from 0 to 10 carbon atoms; for example, amino, methylamino, dimethylamino, diethylamino, dibenzylamino, diphenylamino, and ditolylamino), an alkoxy group (preferably one having from 1 to 30 carbon atoms, more preferably one having from 1 to 20 carbon atoms, and especially preferably one having from 1 to 10 carbon atoms; for example, methoxy, ethoxy, butoxy, and 2-ethylhexyloxy), an aryloxy group (preferably one having from 6 to 30 carbon atoms, more preferably one having from 6 to 20 carbon atoms, and especially preferably one having from 6 to 12 carbon atoms; for example, phenyloxy, 1-naphthyloxy, and 2-naphthyloxy), a hetero-aryloxy group (preferably one having from 1 to 30 carbon atoms, more preferably one having from 1 to 20 carbon atoms, and especially preferably one having from 1 to 12 carbon atoms; for example, pyridyloxy, pyrazyloxy, pyrimidyloxy, and quinolyloxy), an acyl group (preferably one having from 1 to 30 carbon atoms, more preferably one having from 1 to 20 carbon atoms, and especially preferably one having from 1 to 12 carbon atoms; for example, acetyl, benzoyl, formyl, and pivaloyl), an alkoxycarbonyl group (preferably one having from 2 to 30 carbon atoms, more preferably one having from 2 to 20 carbon atoms, and especially preferably one having from 2 to 12 carbon atoms; for example, methoxycarbonyl and ethoxycarbonyl), an aryloxycarbonyl group (preferably one having from 7 to 30 carbon atoms, more preferably one having from 7 to 20 carbon atoms, and especially preferably one having from 7 to 12 carbon atoms; for example, phenyloxycarbonyl), an acyloxy group (preferably one having from 2 to 30 carbon atoms, more preferably one having from 2 to 20 carbon atoms, and especially preferably one having from 2 to 10 carbon atoms; for example, acetoxy and benzoyloxy), an acylamino group (preferably one having from 2 to 30 carbon atoms, more preferably one having from 2 to 20 carbon atoms, and especially preferably one having from 2 to 10 carbon atoms; for example, acetylamino and benzoylamino), an alkoxycarbonylamino group (preferably one having from 2 to 30 carbon atoms, more preferably one having from 2 to 20 carbon atoms, and especially preferably one having from 2 to 12 carbon atoms; for example, methoxycarbonylamino), an aryloxycarbonylamino group (preferably one having from 7 to 30 carbon atoms, more preferably one having from 7 to 20 carbon atoms, and especially preferably one having from 7 to 12 carbon atoms; for example, phenyloxycarbonylamino), a sulfonylamino group (preferably one having from 1 to 30 carbon atoms, more preferably one having from 1 to 20 carbon atoms, and especially preferably one having from 1 to 12 carbon atoms; for example, methanesulfonylamino and benzenesulfonylamino), a sulfamoyl group (preferably one having from 0 to 30 carbon atoms, more preferably one having from 0 to 20 carbon atoms, and especially preferably one having from 0 to 12 carbon atoms; for example, sulfamoyl, methylsulfamoyl, dimethylsulfamoyl, and phenylsulfamoyl), a carbamoyl group (preferably one having from 1 to 30 carbon atoms, more preferably one having from 1 to 20 carbon atoms, and especially preferably one having from 1 to 12 carbon atoms; for example, carbamoyl, methylcarbamoyl, diethylcarbamoyl, and phenylcarbamoyl), an alkylthio group (preferably one having from 1 to 30 carbon atoms, more preferably one having from 1 to 20 carbon atoms, and especially preferably one having from 1 to 12 carbon atoms; for example, methylthio and ethylthio); an arylthio group (preferably one having from 6 to 30 carbon atoms, more preferably one having from 6 to 20 carbon atoms, and especially preferably one having from 6 to 12 carbon atoms; for example, phenylthio), a heteroarylthio group (preferably one having from 1 to 30 carbon atoms, more preferably one having from 1 to 20 carbon atoms, and especially preferably one having from 1 to 12 carbon atoms; for example, pyridylthio, 2-benzimidazolylthio, 2-benzoxazolylthio, and 2-benzthiazolylthio), a sulfonyl group (preferably one having from 1 to 30 carbon atoms, more preferably one having from 1 to 20 carbon atoms, and especially preferably one having from 1 to 12 carbon atoms; for example, mesyl and tosyl), a sulfinyl group (preferably one having from 1 to 30 carbon atoms, more preferably one having from 1 to 20 carbon atoms, and especially preferably one having from 1 to 12 carbon atoms; for example, methanesulfinyl and benzenesulfinyl), an ureido group (preferably one having from 1 to 30 carbon atoms, more preferably one having from 1 to 20 carbon atoms, and especially preferably one having from 1 to 12 carbon atoms; for example, ureido, methylureido, and phenylureido), a phosphoric amide group (preferably one having from 1 to 30 carbon atoms, more preferably one having from 1 to 20 carbon atoms, and especially preferably one having from 1 to 12 carbon atoms; for example, diethylphosphoric amide and phenylphosphoric amide), a hydroxy group, a mercapto group, a halogen atom (for example, a fluorine atom, a chlorine atom, a bromine atom, and an iodine atom), a cyano group, a sulfo group, a carboxyl group, a nitro group, a hydroxamic acid group, a sulfino group, a hydrazino group, an imino group, a heterocyclic group (preferably one having from 1 to 30 carbon atoms, and more preferably one having from 1 to 12 carbon atoms, and of these, a heteroaryl group is preferable; examples of the hetero atom include a nitrogen atom, an oxygen atom, and a sulfur atom; and specific examples thereof imidazolyl, pyridyl, quinolyl, furyl, thienyl, piperidyl, morpholino, benzoxazolyl, benzimidazolyl, benzthiazolyl, carbazolyl, and azepinyl), and a silyl group (preferably one having from 3 to 40 carbon atoms, more preferably one having from 3 to 30 carbon atoms, and especially preferably one having from 3 to 24 carbon atoms; for example, trimethylsilyl and triphenylsilyl).

Specific examples of the connecting group represented by L will be given below, but it should not be construed that the invention is limited thereto. In the following connecting groups, though each of bondings may have $Ar^1$ in formula (1), the invention is not limited thereto, but it is only required that at least three bondings has $Ar^1$. In this case, a hydrogen atom or a usual substituent (preferably a group selected among the foregoing substituent group A) may be bonded to a bonding or bondings to which $Ar^1$ is not bonded.

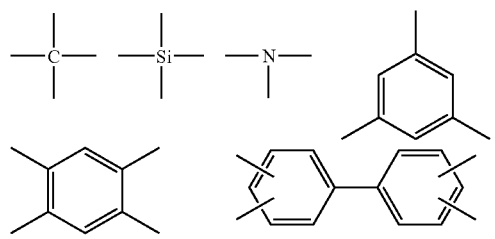

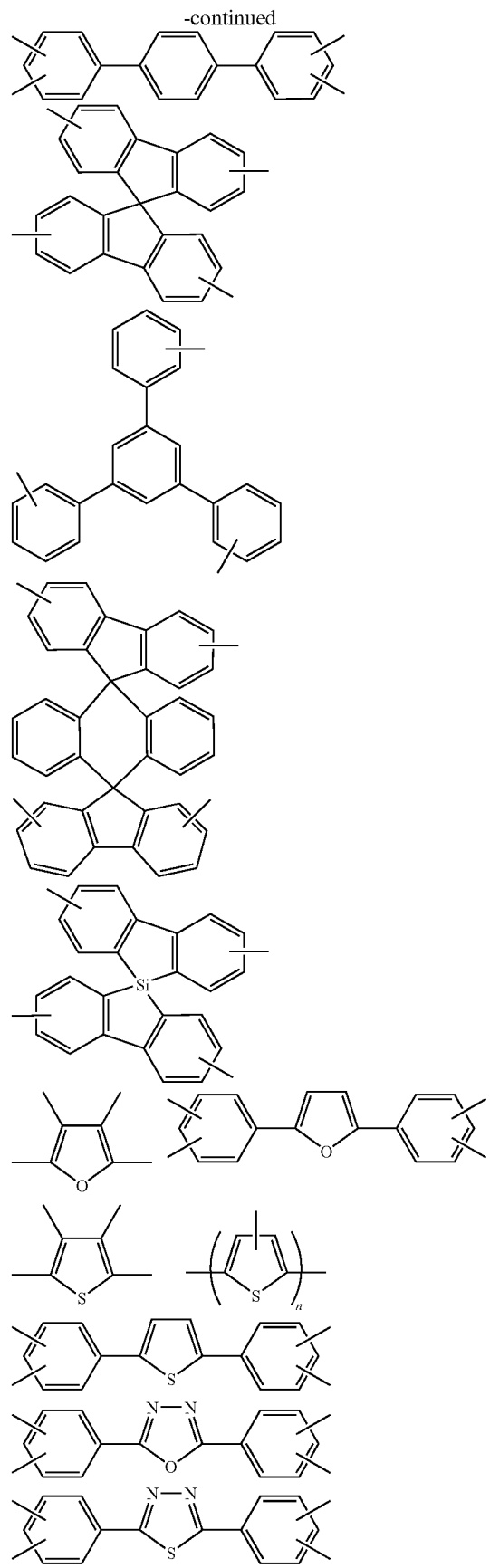

-continued
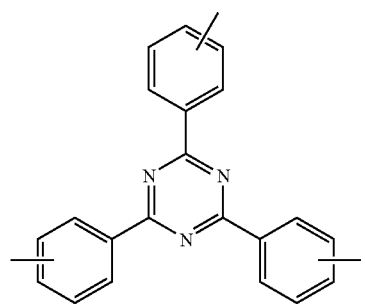
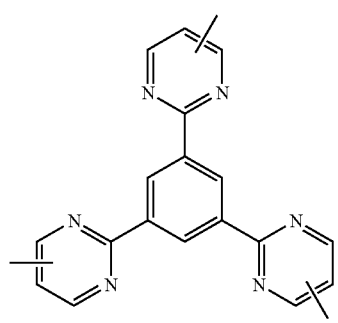
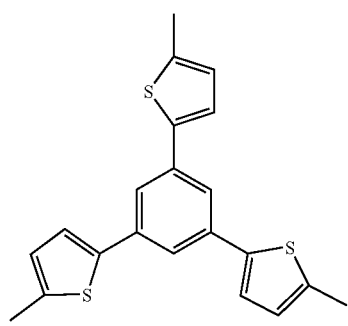
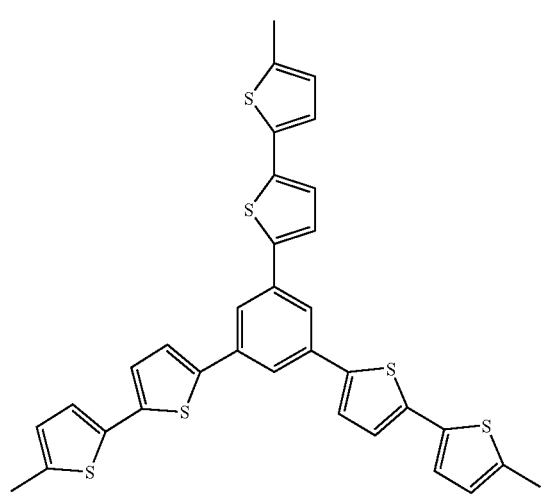
-continued
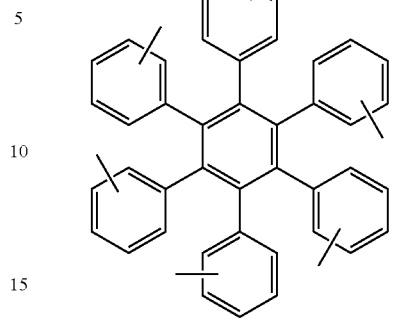
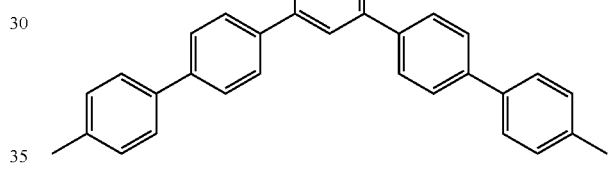
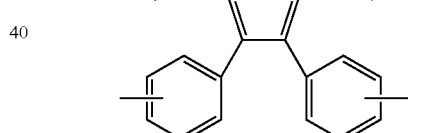
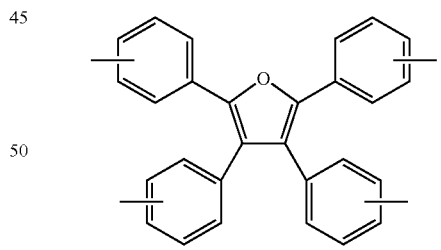
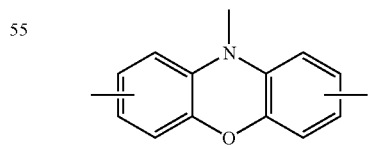
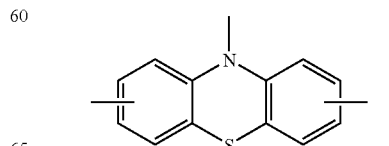

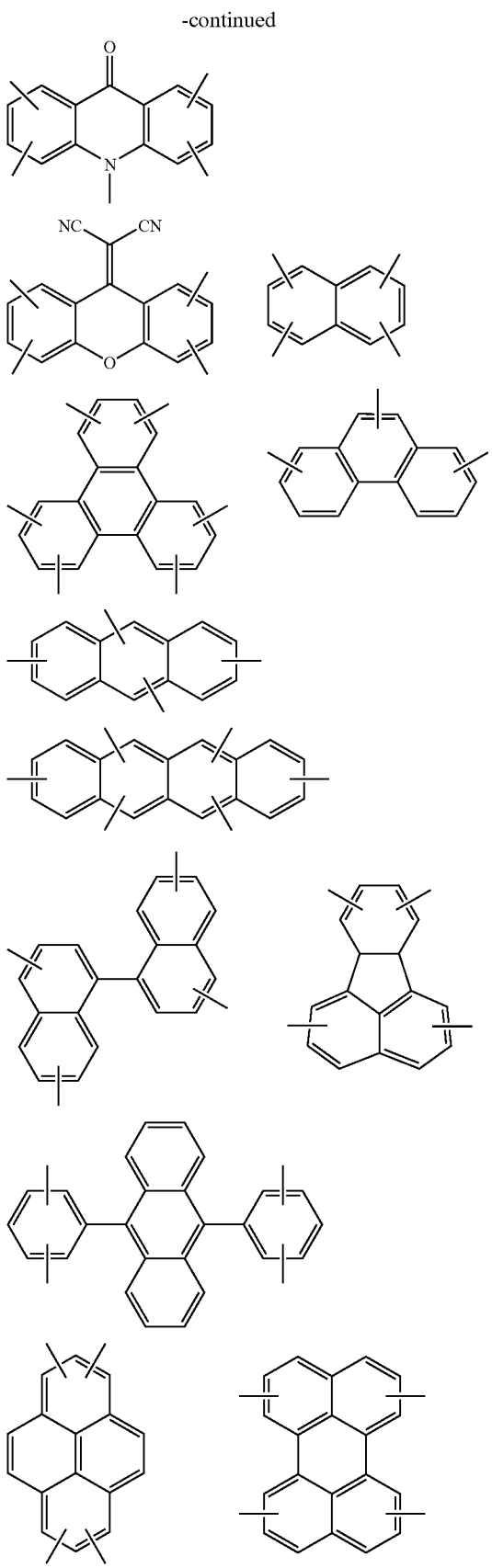

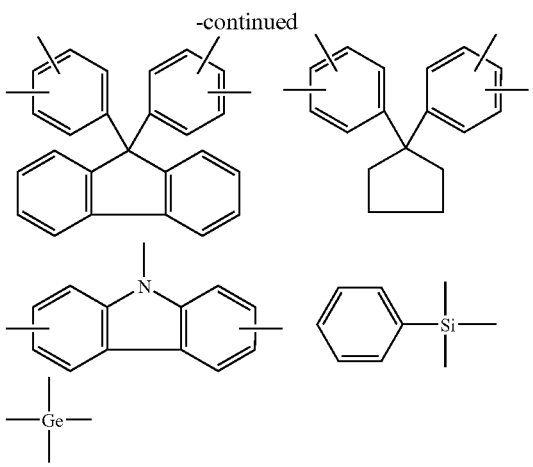

Ar¹ in formula (1) represents a group represented by formula (2); and m represents an integer of 3 or more. m is preferably from 3 to 6, and more preferably 3 or 4.

The group represented by formula (2) will be described below.

Q in formula (2) represents a residue for forming an aryl ring or a heteroaryl ring. Here, the aryl ring or heteroaryl ring which is formed including Q is preferably a benzene ring, a naphthalene ring, an anthracene ring, a pyridine ring, a pyrimidine ring, a pyrrole ring, or a carbazole ring; more preferably a benzene ring or a pyridine ring; and most preferably a benzene ring.

Q may have a substituent. Examples of the substituent are the same as in the foregoing substituent group A. Of these, an alkyl group, an aryl group, and a heteroaryl group are preferable; and an aryl group and a heteroaryl group are more preferable.

Ar² represents an aryl group or a heteroaryl group; more preferably a monocyclic, bicyclic or tricyclic aryl or heteroaryl group; further preferably a monocyclic, bicyclic or tricyclic aryl or nitrogen-containing heteroaryl group; especially preferably a phenyl group, a pyridyl group, a pyrimidyl group, or a carbazolyl group; and most preferably a phenyl group.

Ar² may have a substituent. Examples of the substituent are the same as in the foregoing substituent group A. Of these, an alkyl group, an aryl group, and a heteroaryl group are preferable; and an aryl group and a heteroaryl group are more preferable.

The group represented by formula (2) is preferably a group represented by formula (3).

Formula (3)

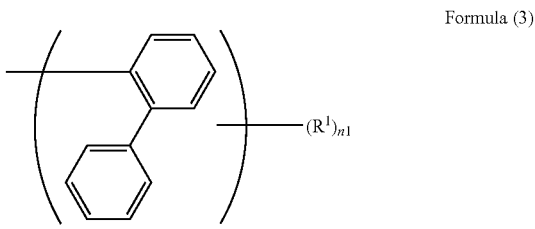

R¹ in formula (3) represents a substituent. Examples of the substituent are the same as in the foregoing substituent group A. Of these, an alkyl group, an aryl group, and a heteroaryl group are preferable; an aryl group and a heteroaryl group are more preferable; a phenyl group, a pyridyl group, and a carbazolyl group are further preferable; and a phenyl group is the most preferable.

n1 represents an integer of from 0 to 9. In the case where n1 is 2 or more, $R^1$s may be the same or different. n1 is preferably from 0 to 5, more preferably from 0 to 3, and most preferably 0.

Examples of the compound of formula (1) will be given below, but it should not be construed that the invention is limited thereto.

(1-1)

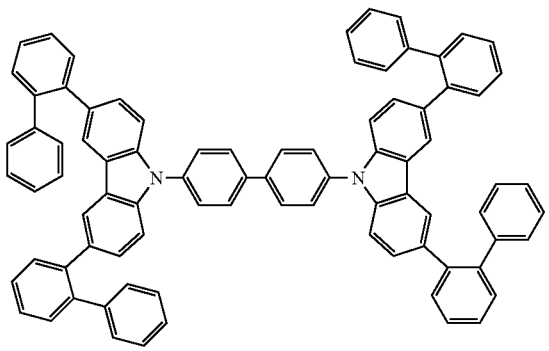

(1-2)

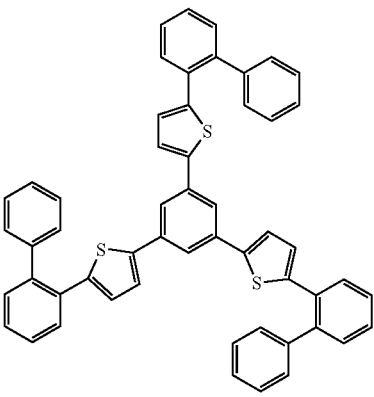

(1-3)

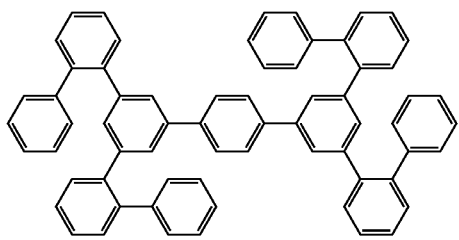

(1-4)

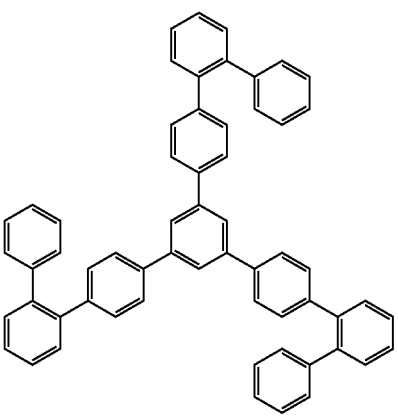

(1-5)

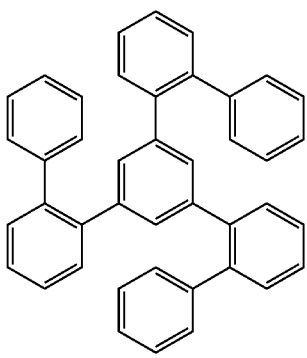

(1-6)

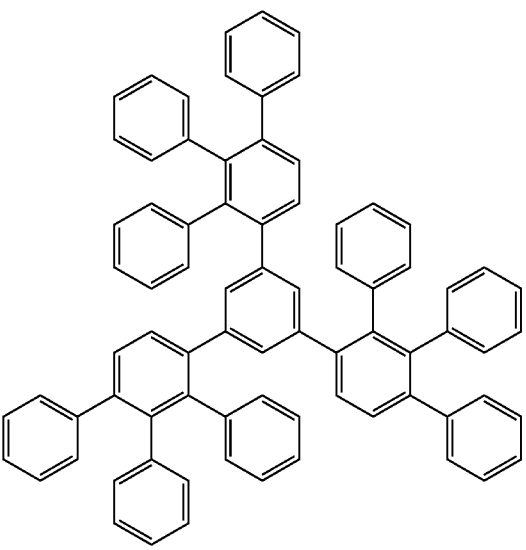

-continued
(1-7)
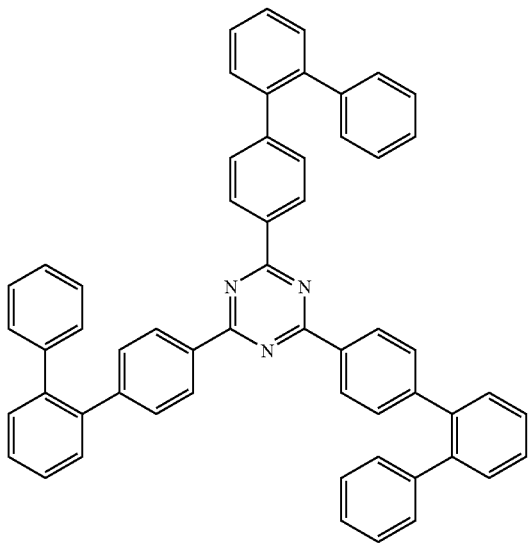
(1-8)
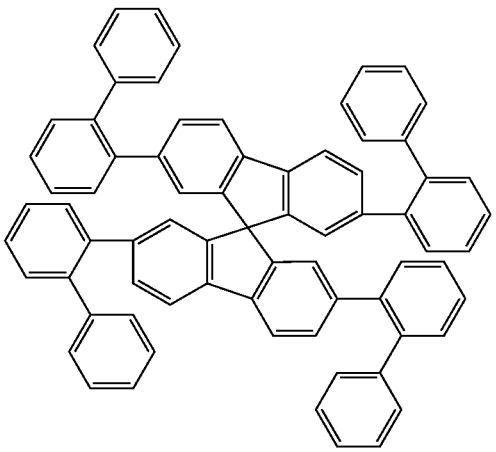
(1-9)
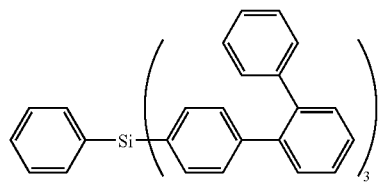
(1-10)
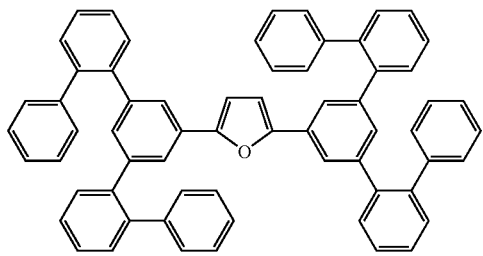
(1-11)
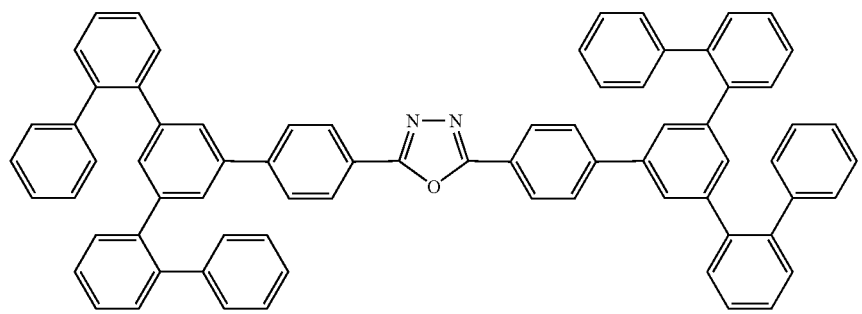
(1-12)
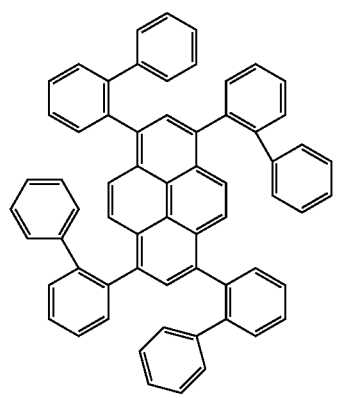
(1-13)
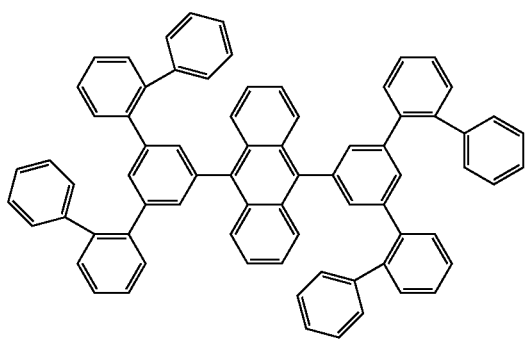

-continued
(1-14)
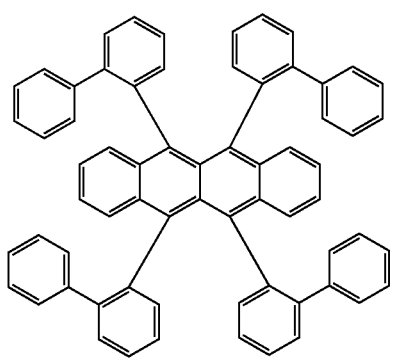
(1-15)
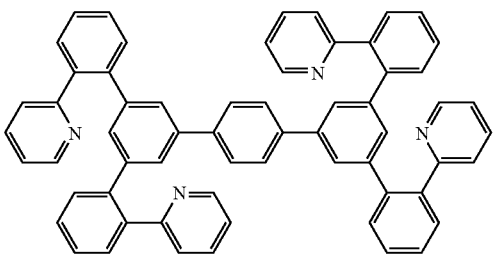
(1-16)
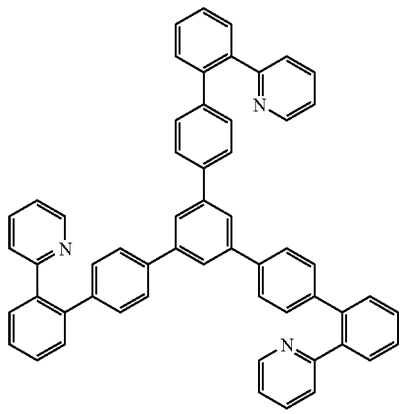
(1-17)
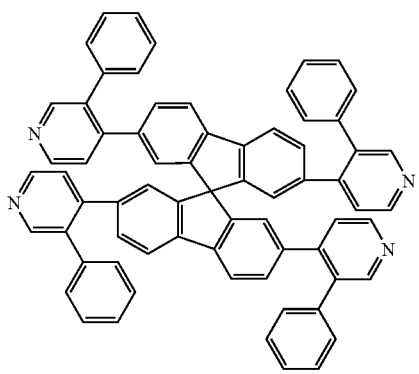
(1-18)
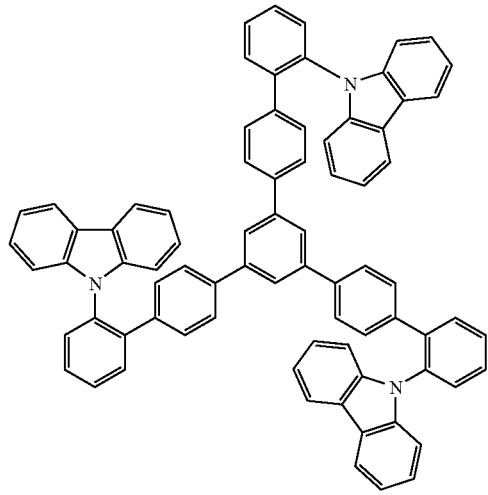
(1-19)
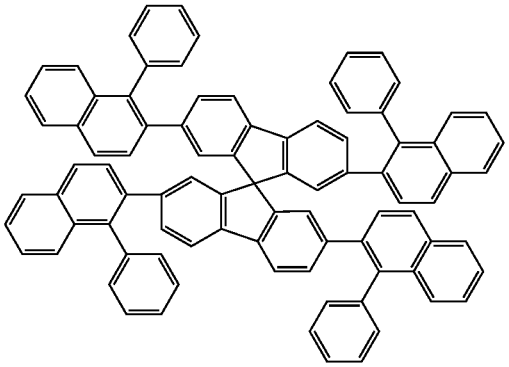
(1-20)
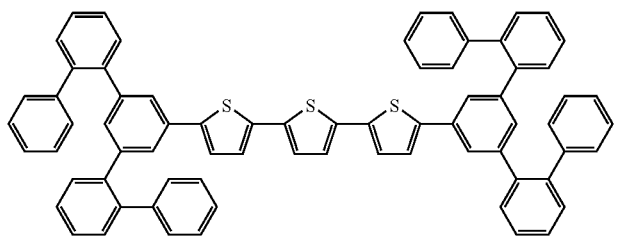

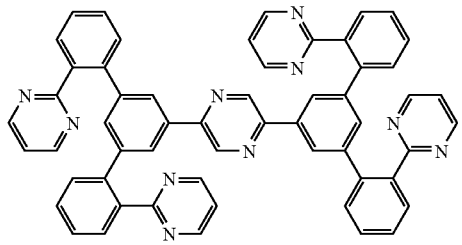

(1-21)

The construction of the light emitting device of the invention and the like will be described below in detail.

It is preferable from the standpoint of luminous efficiency that the light emitting device of the invention utilizes phosphorescent light emission, that is, the light emitting material comprises a phosphorescent material.

The phosphorescent material is not particularly limited but is preferably a transition metal complex. The central metal of the transition metal complex is not particularly limited. The central metal is preferably iridium, platinum, rhenium, or ruthenium; more preferably iridium or platinum; and further preferably iridium. Also, the transition metal complex is preferably an orthometalated complex. The term "orthometalated complex" as referred to herein is a general term of the group of compounds described in, for example, Akio Yamamoto, *Yukikinzoku-Kagaku, Kiso to Oyo* (Metalorganic Chemistry, Foundation and Application), pages 150 and 232, published by Shokabo Publishing Co., Ltd. (1982); and H. Yersin, *Photochemistry and Photophysics of Coordination Compounds*, pp. 71-77 and pp. 135-146, published by Springer-Verlag (1987).

The phosphorescent material which is used in the invention is a material preferably having a phosphorescent quantum yield of 70% or more, more preferably 80% or more, and further preferably 85% or more at 20° C.

From the viewpoint of color purity, the light emitting device of the invention preferably has a half band width of light emission spectrum of not more than 100 nm, more preferably not more than 90 nm, further preferably not more than 80 nm, and especially preferably not more than 70 nm.

The light emitting device of the invention also includes devices in which other light emitting material is excited due to exciton energy of the phosphorescent material, whereby it substantially undergoes light emission.

The light emitting device of the invention contains a compound represented by formula (1) in the light emitting layer. In this case, it is preferred to make the compound represented by formula (1) function as a host material. The "host material" as referred to herein means a material having a function to cause energy transfer into the light emitting material from the excited state thereof, thereby making the light emitting material to undergo light emission.

Further, it is preferable that the light emitting layer contains a compound capable of at least one of injecting and transporting a hole (hereinafter referred to as "hole injection/transport compound (A)") or a compound capable of at least one of injecting and transporting an electron (hereinafter referred to as "electron injection/transport compound (B)") along with the compound represented by formula (1).

The "hole injection/transport compound (A)" as referred to herein, which is contained in the light emitting layer, means a compound performing injection or transport of a hole in the light emitting layer, in which the injection or transport of a hole is promoted by its addition in the light emitting layer, in another word, a compound in which its Ip (ionization potential) value is a value suitable for the hole injection or transport (for example, a value as described later).

In the case where the hole injection/transport compound (A) is contained in the light emitting layer, the injection of a hole into the light emitting layer becomes easy so that a drive voltage can be lowered, whereby it becomes possible to suppress decomposition of the material caused due to application of a high electric field. Also, since the compound (A) performs hole transport, it is possible to suppress decomposition of the material caused due to the matter that a hole is injected into the compound represented by formula (1).

The Ip (ionization potential) value of the hole injection/transport compound (A) is preferably from 5.0 eV to 6.1 eV, more preferably from 5.1 eV to 6.0 eV, and further preferably from 5.2 eV to 5.9 eV.

In the case where the hole injection/transport compound (A) is contained in the light emitting layer along with the compound represented by formula (1), with respect to the proportion of concentrations of these compounds in the light emitting layer, it is preferable that the amount of the compound represented by formula (1) is from 95 parts by weight to 10 parts by weight, whereas the amount of the hole injection/transport compound (A) is from 5 parts by weight to 90 parts by weight; it is more preferable that the amount of the compound represented by formula (1) is from 90 parts by weight to 15 parts by weight, whereas the amount of the hole injection/transport compound (A) is from 10 parts by weight to 85 parts by weight; and it is further preferable that the amount of the compound represented by formula (1) is from 90 parts by weight to 20 parts by weight, whereas the amount of the hole injection/transport compound (A) is from 10 parts by weight to 80 parts by weight. At this time, the amount of the light emitting material is preferably from 0.01 parts by weight to 30 parts by weight, more preferably from 1 part by weight to 15 parts by weight, and further preferably from 3 parts by weight to 10 parts by weight based on the compound represented by formula (1).

Preferred examples of the hole injection/transport compound (A) include triarylamine derivatives, hydrocarbon aromatic derivatives (for example, benzene derivatives, anthracene derivatives, and pyrene derivatives), pyrrole derivatives (for example, pyrrole derivatives, indole derivatives, and carbazole derivatives), and azepine derivatives (for example, benzazepine derivatives). Of these, pyrrole derivatives are more preferable.

The "electron injection/transport compound (B)" as referred to herein, which is contained in the light emitting layer, means a compound performing injection or transport of an electron in the light emitting layer, in which the injection or transport of an electron is promoted by its addition in the light emitting layer, in another word, a compound in which its Ea (electron affinity) value is a value suitable for the electron injection/transport (for example, a value as described later).

In the case where the electron injection/transport compound (B) is contained in the light emitting layer, the injection of an electron into the light emitting layer becomes easy so that a drive voltage can be lowered, whereby it becomes possible to suppress decomposition of the material caused due to application of a high electric field. Also, since the compound (B) performs electron transport, it is possible to suppress decomposition of the material caused due to the matter that an electron is injected into the compound represented by formula (1).

The Ea (electron affinity) value of the electron injection/transport compound (B) is preferably from 2.0 eV to 3.5 eV, more preferably from 2.3 eV to 3.4 eV, and further preferably from 2.5 eV to 3.3 eV.

In the case where the electron injection/transport compound (B) is contained in the light emitting layer along with the compound represented by formula (1), with respect to the proportion of concentrations of these compounds in the light emitting layer, it is preferable that the amount of the compound represented by formula (1) is from 95 parts by weight to 10 parts by weight, whereas the amount of the electron injection/transport compound (B) is from 5 parts by weight to 90 parts by weight; it is more preferable that the amount of the compound represented by formula (1) is from 90 parts by weight to 15 parts by weight, whereas the amount of the electron injection/transport compound (B) is from 10 parts by weight to 85 parts by weight; and it is further preferable that the amount of the compound represented by formula (1) is from 90 parts by weight to 20 parts by weight, whereas the amount of the electron injection/transport compound (B) is from 10 parts by weight to 80 parts by weight. At this time, the amount of the light emitting material is preferably from 0.01 parts by weight to 30 parts by weight, more preferably from 1 part by weight to 15 parts by weight, and further preferably from 3 parts by weight to 10 parts by weight based on the compound represented by formula (1).

Preferred examples of the electron injection/transport compound (B) include metal complexes (for example, aluminum complexes and zinc complexes; however, complexes containing an 8-hydroxyquinolinol derivative (for example, 2-methyl-8-hydroxyquinolinol) as a ligand are not preferable), nitrogen-containing heterocyclic compounds (for example, azole derivatives, pyridine derivatives, and triazine derivatives), and organosilicon compounds (for example, silol derivatives). Of these, heterocyclic compounds containing at least two nitrogen atoms and metal complexes are more preferable; heterocyclic compounds containing at least two nitrogen atoms are further preferable; and compounds represented by formula (4) are especially preferable. Also, compounds represented by formulae (A-III), (A-IV), (A-V), (A), (A-a), (A-b), (A-c), (B-II), (B-III), (B-IV), (B-V), (B-VI), (B-VII), (B-VIII) and (B-IX) as described in JP-A-2002-100476 and compounds represented by formulae (1) to (4) as described in JP-A-2000-302754 can be suitably used (preferred ranges thereof are those described in JP-A-2002-100476 and JP-A-2000-302754).

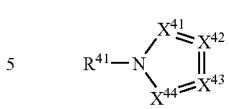

Formula (4)

Formula (4) will be described below.

$R^{41}$ represents a hydrogen atom or a substituent. Examples of the substituent represented by $R^{41}$ are the same as in the foregoing substituent group A. Of these, an alkyl group, an aryl group, and a heteroaryl group are preferable; an aryl group and a heteroaryl group are more preferable; and an aryl group is further preferable.

$X^{41}$, $X^{42}$, $X^{43}$, and $X^{44}$ each independently represents a nitrogen atom or a substituted or unsubstituted carbon atom. At least one of $X^{41}$, $X^{42}$, $X^{43}$, and $X^{44}$ represents a nitrogen atom. Examples of the substituent on the carbon atom are the same as those described above for $R^{41}$. Of these, an alkyl group, an aryl group, and a heteroaryl group are preferable.

It is preferable that $X^{41}$ represents a substituted or unsubstituted carbon atom, $X^{42}$ represents a nitrogen atom, and $X^{43}$ and $X^{44}$ each represents a substituted carbon atom. Also, it is preferable that the substituents on $X^{43}$ and $X^{44}$ are taken together to form an aromatic ring.

A preferred embodiment of the compound represented by formula (4) is a compound represented by formula (5) or formula (6); and a more preferred embodiment of the compound represented by formula (4) is a compound represented by formula (6).

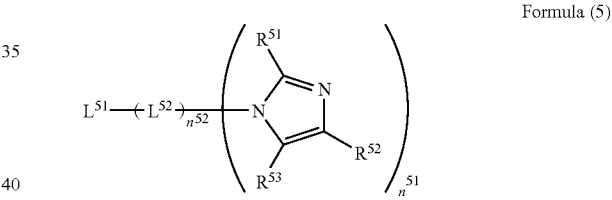

Formula (5)

Formula (6)

Formula (5) will be described below.

$R^{51}$, $R^{52}$, and $R^{53}$ each independently represents a hydrogen atom or a substituent. Examples of the substituent are the same as those described above for $R^{41}$.

As $R^{51}$, an alkyl group, an aryl group, and a heteroaryl group are preferable; an alkyl group and an aryl group are more preferable; and an alkyl group is further preferable.

$R^{52}$ and $R^{53}$ each independently preferably represents an alkyl group, an aryl group, a heteroaryl group, or a group capable of forming an aromatic ring upon bonding to each other; and more preferably a group capable of forming an aromatic ring upon bonding to each other.

$L^{51}$ represents a connecting group. The connecting group may be a polymer principal chain of a polyalkylene, a polyester, etc. (for example, it may form a polyvinylimidazole derivative). $L^{51}$ preferably represents an arylene group, a heteroarylene group, an alkylene group, or an alkylene polymer principal chain; more preferably an arylene group or a heteroarylene group; and further preferably a nitrogen-containing heteroarylene group.

$n^{51}$ represents an integer of 2 or more. In the case where $n^{51}$ is 2 or more, plural nitrogen-containing heterocyclic groups may be the same or different. In the case where $L^{51}$ does not represent a polymer principal chain, $n^{51}$ is preferably from 2 to 6, and more preferably 3 or 4. In the case where $L^{51}$ represents a polymer principal chain, $n^{51}$ becomes a value corresponding to the repeating unit of the polymer principal chain (for example, in the case of a 100-mer of vinylimidazole, $n^{51}$ becomes 100).

$L^{52}$ represents a divalent connecting group. $L^{52}$ preferably represents an alkylene group, an arylene group, a heteroarylene group, an oxygen (—O—), a carbonyl group, or an amino group, and more preferably an alkylene group or an arylene group.

$n^{52}$ represents an integer of 0 or more. In the case where $n^{51}$ is the plural number, plural $L^{52}$s may be the same or different. In the case where $L^{51}$ does not represent a polymer principal chain, $n^{52}$ is preferably from 0 to 6, more preferably from 0 to 3, and most preferably 0 or 1. In the case where $L^{51}$ represents a polymer principal chain, $n^{52}$ becomes a value corresponding to the repeating unit of the polymer principal chain (for example, in the case of a 100-mer of vinylimidazole, $n^{52}$ becomes 100).

Formula (6) will be described below. $R^{62}$ and $R^{63}$ each independently represents a hydrogen atom or a substituent. Examples of the substituent are the same as those described above for $R^{41}$.

$R^{62}$ and $R^{63}$ each independently preferably represents an alkyl group, an aryl group, a heteroarylene group, or a group capable of forming an aromatic ring upon bonding to each other; more preferably a group capable of forming an aromatic ring upon bonding to each other; and further preferably a group capable of forming a nitrogen-containing aromatic ring upon bonding to each other.

$R^{64}$ represents a hydrogen atom or a substituent. Examples of the substituent are the same as those described above for $R^{41}$. $R^{64}$ preferably presents an alkyl group, an aryl group, or a heteroarylene group; more preferably an aryl group or a heteroarylene group; and further preferably an aryl group.

$L^{61}$ represents a connecting group. The connecting group may be a polymer principal chain of a polyalkylene, a polyester, etc. (for example, it may form a polyvinylimidazole derivative). $L^{61}$ preferably represents an arylene connecting group, a heteroarylene group, an alkylene group, or an alkylene polymer principal chain; more preferably an arylene group or a heteroarylene group; and further preferably an arylene group.

$L^{62}$, $n^{61}$ and $n^{62}$ are synonymous with $L^{52}$, $n^{51}$ and $n^{52}$, respectively, and preferred ranges thereof are also the same.

The light emitting device of the invention does not matter about the system, drive method and use behavior so far as it is a device utilizing the compound of the invention.

The formation method of the light emitting device containing the compound of the invention is not particularly limited. However, examples thereof include methods such as an ohmic-resistance heating vapor deposition method, an electron beam method, a sputtering method, a molecular lamination method, a coating method, an inkjet method, a printing method, and a transfer method. Of these, an ohmic-resistance heating vapor deposition method, a coating method, and a transfer method are preferable in view of characteristics and production.

The light emitting device of the invention is a device in which at least one layer of an organic compound film containing a light emitting layer is formed between a pair of electrodes of an anode and a cathode. In addition to the light emitting layer, the light emitting device of the invention may have a hole injection layer, a hole transport layer, an electron injection layer, an electron transport layer, etc. as organic layers and may further have a protective layer. Also, these respective layers may have other function, respectively. In forming each of the layers, various materials can be used.

Specific examples of the layer construction of the light emitting device of the invention include anode/hole transport layer/light emitting layer/electron transport layer/cathode, anode/hole transport layer/light emitting layer/electron transport layer/cathode, anode/hole transport layer/light emitting layer/electron transport layer/electron injection layer/cathode, anode/hole injection layer/hole transport layer/light emitting layer/electron transport layer/cathode, and anode/hole injection layer/hole transport layer/light emitting layer/electron transport layer/electron injection layer/cathode. However, it should not be construed that the invention is limited thereto.

The light emitting device of the invention preferably includes, between the cathode and the light emitting layer, a layer containing a compound having an ionization potential of 5.9 eV or more (more preferably 6.0 eV or more), and more preferably an electron transport layer having an ionization potential of 5.9 eV or more.

A substrate which is used in the light emitting device of the invention is not particularly limited. Examples thereof include inorganic materials (for example, yttrium stabilized zirconia and glass), and high molecular materials for example polyesters (for example, polyethylene terephthalate, polybutylene terephthalate, and polyethylene naphthalate), polyethylene, polycarbonates, polyether sulfones, polyarylates, allyl diglycol carbonates, polyimides, polycycloolefins, norbornene resins, poly(chlorotrifluoroethylene), Teflon, and polytetrafluoroethylene-polyethylene copolymers).

An anode works to feed a hole into the hole injection layer, the hole transport layer, the light emitting layer, and so on. As the anode, metals, alloys, metal oxides, electrically conductive compounds, and mixtures thereof can be used. Of these, materials having a work function of 4.0 eV or more are preferable. Specific examples thereof include conductive metal oxides (for example, tin oxide, zinc oxide, indium oxide, and indium tin oxide (ITO)), metals (for example, gold, silver, chromium, and nickel), mixtures or layered products of these metals with conductive metal oxides, inorganic conductive substances (for example, copper iodide and copper sulfide), organic conductive materials (for example, polyaniline, polythiophene, and polypyrrole), and layered products thereof with ITO. Of these, conductive metal oxides are preferable; and ITO is especially preferable in view of productivity, high conductivity, transparency, etc. The thickness of the anode can be adequately selected depending upon the material. In general, it is preferably in the range of from 10 nm to 5 μm, more preferably from 50 nm to 1 μm, and further preferably from 100 nm to 500 nm.

In general, as the anode, one obtained by layer formation on a soda lime glass, an alkali-free glass, a transparent resin substrate, etc. is used. In the case of using a glass, for the purpose of making the amount of ions eluted from the glass low, it is preferred to use an alkali-free glass. Also, in the case of using a soda lime glass, it is preferred to use one provided with a barrier coating such as silica. The thickness of the substrate is not particularly limited so far as the mechanical strength is sufficiently kept. In the case of using a glass, the thickness of the substrate to be used is usually 0.2 mm or more, and preferably 0.7 mm or more.

In the preparation of the anode, various methods are employable. For example, in the case of ITO, the film is formed by a method inclusive of an electron beam method, a sputtering method, an ohmic-resistance heating vapor deposition method, a chemical reaction method (for example, a sol-gel method), and a coating method of a dispersion of indium tin oxide.

In the anode, it is possible to lower the drive voltage of the device or to enhance the luminous efficiency by rinsing or other treatments. For example, in the case of ITO, a UV-ozone treatment, a plasma treatment, and the like are effective.

A cathode works to feed an electron into the electron injection layer, the electron transport layer, the light emitting layer, and so on and is chosen while taking into account adhesion to a layer (for example, the electron injection layer, the electron transport layer, and the light emitting layer) which is adjacent to the cathode, ionization potential, stability, and the like. As a material of the cathode, metals, alloys, metal halides, metal oxides, electrically conductive compounds, and mixtures thereof can be used. Specific examples thereof include alkali metals (for example, Li, Na, and K) and fluorides or oxides thereof, alkaline earth metals (for example, Mg and Ca) and fluorides or oxides thereof, gold, silver, lead, aluminum, sodium-potassium alloys or mixed metals thereof, lithium-aluminum alloys or mixed metals thereof, magnesium-silver alloys or mixed metals thereof, and rare earth metals (for example, indium and ytterbium). Of these, materials having a work function of not more than 4 eV are preferable; and aluminum, lithium-aluminum alloys or mixed metals thereof, and magnesium-silver alloys or mixed metals thereof are more preferable. The cathode may take not only a single-layered structure of the foregoing compound or mixture but also a layered structure containing the foregoing compound or mixture. For example, a layered structure of aluminum/lithium fluoride or aluminum/lithium oxide is preferable. The thickness of the cathode can be adequately selected depending upon the material. In general, it is preferably in the range of from 10 nm to 5 µm, more preferably from 50 nm to 1 µm, and further preferably from 100 nm to 1 µm.

In the preparation of the cathode, there are employable methods such as an electron beam method, a sputtering method, an ohmic-resistance heating vapor deposition method, and a coating method. A single metal can be subjected to vapor deposition, or two or more components can be subjected to vapor deposition at the same time. Further, it is possible to form an alloy electrode by subjecting plural metals to vapor deposition at the same time. Moreover, an alloy which has been previously prepared may be subjected to vapor deposition. It is preferable that the sheet resistance of the anode and the cathode is preferably low, and preferably not more than several hundreds Ω/□.

As a material of the light emitting layer, any material which can form a layer having such a function that it can not only inject a hole from the anode or the hole injection layer or hole transport layer but also inject an electron from the cathode or the electron injection layer or electron transport layer at the time of applying an electric field, a function to transfer an injected charge, or a function to provide a field of re-coupling of the hole and the electron, thereby undergoing light emission is employable. Examples thereof include various metal complexes typified by metal complexes and rare earth metal complexes of benzoxazole, benzimidazole, benzothiazole, styrylbenzene, polyphenyl, diphenylbutadiene, tetraphenylbutadiene, naphthalimide, coumarin, perylene, perynone, oxadiazole, aldazine, pyrralizine, cyclopentadiene, bisstyrylanthracene, quinacridone, pyrrolopyridine, thiadiazolopyridine, cyclopentadiene, styrylamine, aromatic dimethylidene compounds, and 8-quinolol; polymer compounds such as polythiophene, polyphenylene, and polyphenylenevinylene; organic silanes; iridium trisphenylpyridine complexes; transition metal complexes typified by platinum porphyrin complexes; and derivatives of these complexes. However, at least one of the materials of the light emitting layer is a phosphorescent material.

The thickness of the light emitting layer is not particularly limited. In general, it is preferably in the range of from 1 nm to 5 µm, more preferably from 5 nm to 1 µm, and further preferably from 10 nm to 500 nm.

The formation method of the light emitting layer is not particularly limited. Examples thereof include an ohmic-resistance heating vapor deposition method, an electron beam method, a sputtering method, a molecular lamination method, a coating method (for example, a spin coating method, a casting method, and a dip coating method), an inkjet method, a printing method, an LB method, and a transfer method. Of these, an ohmic-resistance heating vapor deposition method and a coating method are preferable.

The light emitting layer may be formed of a single compound or plural compounds. Also, the light emitting layer may be made of a single layer or plural layers, and the respective layers may undergo light emission of a different light emitting color, for example, a white color. A single light emitting layer may undergo light emission of a white color. In the case of plural light emitting layers, the respective light emitting layers may be formed of a single material or plural compounds.

The light emitting layer of the light emitting device of the invention may have a layered structure composed of plural light emitting layers. The layer number is preferably from 2 layers to 50 layers, more preferably from 4 layers to 30 layers, and further preferably from 6 layers to 20 layers. The thickness of each of the layers constructing the layered structure is not particularly limited but is preferably from 0.2 nm to 20 nm, more preferably from 0.4 nm to 15 nm, further preferably from 0.5 nm to 10 nm, and especially preferably from 1 nm to 5 nm.

Also, the light emitting layer of the light emitting device of the invention may have plural domain structures (a fine region comprising a material such as a host material and a light emitting material, or a mixture thereof). The light emitting layer may have plural domain structures made of the same material or plural domain structures made of a different material. The size of each domain is preferably from 0.2 nm to 10 nm, more preferably from 0.3 nm to 5 nm, further preferably from 0.5 nm to 3 nm, and especially preferably from 0.7 nm to 2 nm.

As a material of the hole injection layer or the hole transport layer, any material having any one of a function to inject a hole from the anode, a function to transport a hole, or a function to block an electron injected from the cathode is employable. Specific examples thereof include conductive, carbazole, triazole, oxazole, oxadiazole, imidazole, polyarylalkanes, pyrazoline, pyrazolone, phenylenediamine, arylamines, amino-substituted chalcones, styrylanthracene, fluorenone, hydrazone, stilbene, silazane, aromatic tertiary amine compounds, styrylamine compounds, aromatic dimethylidene based compounds, porphyrin based compounds, polysilane based compounds, high molecular oligomers (for example poly(N-vinylcarbazole, aniline based copolymers, thiophene oligomers, and polythiophene), organic silane derivatives, carbon films, and derivatives thereof. The thickness of the hole injection layer or the hole transport layer is not particularly limited. In general, it is preferably in the range of from 1 nm to 5 µm, more preferably from 5 nm to 1 µm, and further preferably from 10 nm to 500 nm. The hole injection layer or the hole transport layer may be of a single-layered structure made of one or two or more kinds of the foregoing materials or of a multilayered structure of plural layers made of the same composition or a different composition.

Examples of the formation method of the hole injection layer or the hole transport layer include a vacuum vapor deposition method, an LB method, a method of coating a solution or dispersion of the foregoing hole injection material or hole transport material in a solvent (for example, a spin coating method, a casting method, and a dip coating method), an inkjet method, a printing method, and a transfer method. In the case of a coating method, the hole injection material or hole transport material can be dissolved or dispersed along with a resin component. Examples of the resin component include polyvinyl chloride, polycarbonates, polystyrene, polymethyl methacrylate, polybutyl methacrylate, polyesters, polysulfones, polyphenylene oxide, polybutadiene, poly(N-vinylcarbazole), hydrocarbon resins, ketone resins, phenoxy reins, polyamides, ethyl cellulose, vinyl acetate resins, ABS resins, polyurethanes, melamine resins, unsaturated polyester resins, alkyd resins, epoxy resins, and silicone resins.

As a material of the electron injection layer or the electron transport layer, any material having any one of a function to inject an electron from the cathode, a function to transport an electron, or a function to block a hole injected from the anode is employable. Specific examples thereof include triazole, oxazole, oxadiazole, imidazole, fluorenone, anthraquinodimethane, anthrone, diphenylquinone, thiopyranedioxide, carbodiimide, fluorenilidenemethane, distyrylpyrazine, naphthalene, aromatic ring tetracarboxylic anhydrides such as perylene, phthalocyanine, metal complexes of 8-quinolinol, various metal complexes typified by metal complexes having metal phthalocyanine, benzoxazole, or benzothiazole as a ligand, organic silanes, and derivatives thereof. The thickness of the electron injection layer or the electron transport layer is not particularly limited. In general, it is preferably in the range of from 1 nm to 5 µm, more preferably from 5 nm to 1 µm, and further preferably from 10 nm to 500 nm. The electron injection layer or the electron transport layer may be of a single-layered structure made of one or two or more kinds of the foregoing materials or of a multilayered structure of plural layers made of the same composition or a different composition.

Examples of the formation method of the electron injection layer or the electron transport layer include a vacuum vapor deposition method, an LB method, a method of coating a solution or dispersion of the foregoing electron injection material or electron transport material in a solvent (for example, a spin coating method, a casting method, and a dip coating method), an inkjet method, a printing method, and a transfer method. In the case of a coating method, the electron injection material or electron transport material can be dissolved or dispersed along with a resin component. Examples of the resin component include those as enumerated above for the case of the hole injection layer of the hole transport layer.

As a material of the protective layer, any material having a function to inhibit invasion of a substance which promotes deterioration of the device (for example, moisture or oxygen) into the device is employable. Specific examples thereof metals (for example, In, Sn, Pb, Au, Cu, Ag, Al, Ti, and Ni), metal oxides (for example, MgO, SiO, $SiO_2$, $Al_2O_3$, GeO, NiO, CaO, BaO, $Fe_2O_3$, $Y_2O_3$, and $TiO_2$), metal fluorides (for example, $MgF_2$, LiF, $AlF_3$, and $CaF_2$), nitrides (for example, $SiN_x$ and $SiO_xN_y$), polyethylene, polypropylene, polymethyl methacrylate, polyimides, polyureas, polytetrafluoroethylene, polychlorotrifluoroethylene, polydichlorodifluoroethylene, copolymers of chlorotrifluoroethylene and dichlorodifluoroethylene, copolymers obtained by copolymerizing a monomer mixture containing tetrafluoroethylene and at least one kind of a comonomer; fluorine-containing copolymers having a cyclic structure in the copolymer principal chain, water absorbing substances having a water absorption of 1% or more, and moisture-proof substances having a water absorption of not more than 0.1%.

The formation method of the protective layer is not particularly limited, and examples thereof include a vacuum vapor deposition method, a sputtering method, a reactive sputtering method, an MBE (molecular beam epitaxy) method, a cluster ion beam method, an ion plating method, a plasma polymerization method (high-frequency excitation ion plating method), a plasma CVD method, a laser CVD method, a heat CVD method, a gas source CVD method, a coating process, a printing method, and a transfer method.

In the light emitting device of the invention, it is possible to enhance the light extraction efficiency by various known devices. For example, it is possible to enhance the light extraction efficiency and to enhance the external quantum efficiency by processing the surface shape of the substrate (for example, forming a fine irregular pattern), controlling the refractive index of the substrate, ITO layer or organic layer, controlling the thickness of the substrate, ITO layer or organic layer, or the like.

The light emitting device of the invention may be of a so-called top emission system for extracting light from the anode side.

EXAMPLES

The invention will be specifically described below with reference to the Examples, but it should not be construed that the invention is limited thereto.

Example 1

This Example was carried out for the purpose of evaluating the crystallinity of a compound.

First of all, a rinsed glass substrate was placed in a vapor deposition unit, and a compound to be evaluated as shown in the following Table 1 was subjected to vapor deposition thereon in a thickness of 100 nm. The resulting glass substrate was heated on a hot plate at 85° C. and visually observed with respect to the behavior of the vapor deposition film. In the case where a compound is crystallized, cloudiness is observed on the vapor deposition film.

TABLE 1

| Compound | Results |
|---|---|
| CBP (Comparative example) | Cloudiness is observed 19 hours after start of heating. |
| Compound (1-1) (Invention) | Cloudiness is not observed 3 days or more after start of heating. |
| Compound A (Comparative example) | Cloudiness is observed immediately after vapor deposition. |
| Compound (1-2) (Invention) | Cloudiness is not observed 3 days or more after start of heating. |

TABLE 1-continued

| Compound | Results |
|---|---|

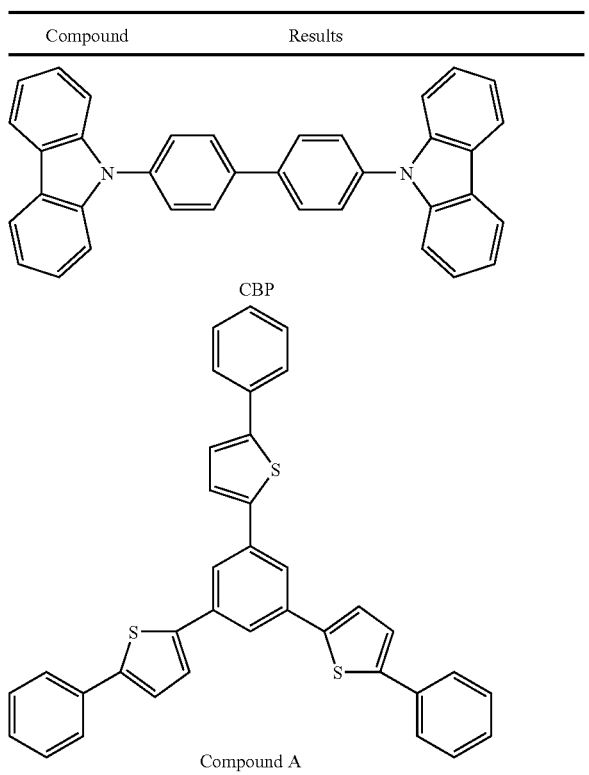

As is clear from the results shown in Table 1, it is evident that in Compound (1-1) and Compound (1-2) which are described as examples of the compound of formula (1) of the invention, cloudiness caused due to crystallization is not observed over 3 days or more, whereby the crystallization is remarkably lowered.

Example 2

A rinsed ITO substrate was placed in a vapor deposition unit, copper phthalocyanine as a hole injection material was first subjected to vapor deposition thereon in a thickness of 10 nm, and α-NPD (N,N'-diphenyl-N,N'-di(α-naphthyl)-benzidine) as a hole transport material was further subjected to vapor deposition thereon in a thickness of 30 nm. Thereafter, the foregoing Compound (1-1) and Compound a having the following structure, which is an iridium complex, were subjected to co-vapor deposition thereon at a ratio of 20/1 (by weight) in a thickness of 30 nm (light emitting layer), and BAlq having the following structure, which is an aluminum complex, was further subjected to vapor deposition thereon in a thickness of 10 nm (block layer), followed by subjecting Alq$_3$ having the following structure, which is an aluminum complex, to vapor deposition thereon in a thickness of 40 nm (electron transport layer).

A patterned mask (a mask having a light emitting area of 4 mm×5 mm) was placed on this organic thin film, and lithium fluoride was subjected to vapor deposition thereon in a thickness of about 1 nm, and aluminum was further subjected to vapor deposition thereon in a thickness of about 200 nm within the vapor deposition unit, thereby preparing a light emitting device. Using a source measure unit Mode 2400, manufactured by TOYO TECHNICA INC., a direct current voltage was applied to the light emitting device to undergo light emission, and its luminance was measured using a luminance meter BM-8, manufactured by TOPCON CORPORATION, and its light emission wavelength was measured using a spectral analyzer PMA-11, manufactured by HAMAMATSU PHOTONICS K.K.

As a result, red light emission having a chromaticity value (0.66, 0.33) was obtained, and the external quantum efficiency of the device was 7.1%.

Also, when the device durability of this device is evaluated at an initial luminance of 300 cd/m$^2$ and at a constant current value, the half-time of luminance is about 1,200 hours.

Example 3

A device was prepared and evaluated in the same manners as in Example 2, except that Compound (1-1) and Compound b having the following structure (electron injection/transport material) were used in a weight ratio of 1/1 in place of the Compound (1-1). As a result, red light emission having a chromaticity value (0.66, 0.32) was obtained, and the external quantum efficiency of the device was 8.1%.

When the device durability of this device is evaluated at an initial luminance of 300 cd/m$^2$ and at a constant current value, the half-time of luminance is about 1,600 hours.

Comparative Example 1

A device was prepared and evaluated in the same manners as in Example 2, except that Compound CBP having the following structure was used in place of the Compound (1-1). As a result, red light emission having a chromaticity value (0.65, 0.32) was obtained, and the external quantum efficiency of the device was 6.0%.

When the device durability of this device is evaluated at an initial luminance of 300 cd/m$^2$ and at a constant current value, the half-time of luminance is about 800 hours.

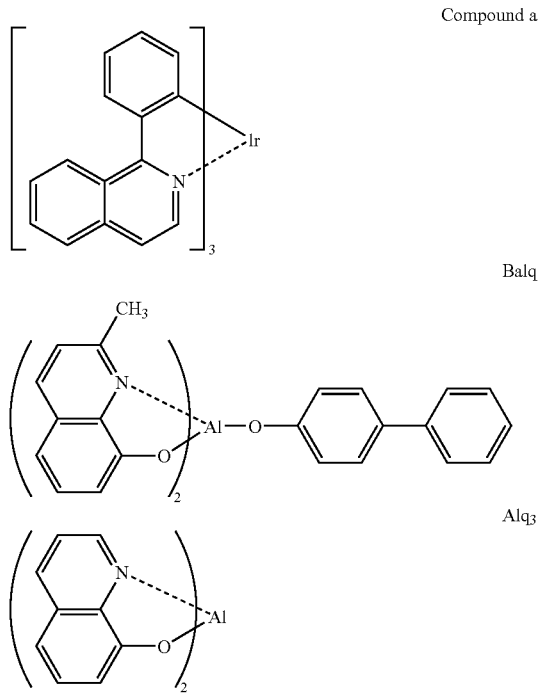

-continued

Compound b

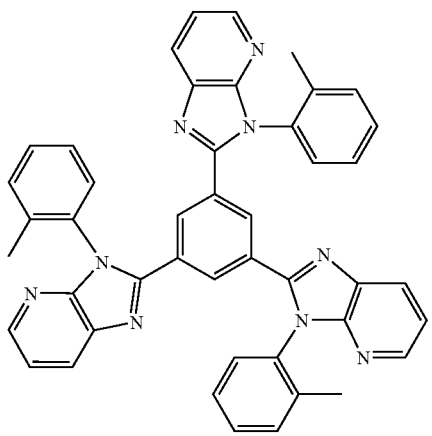

CBP

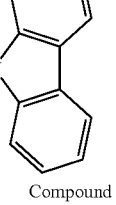

Compound c

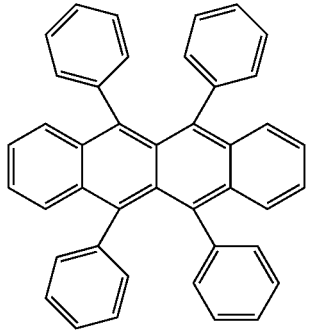

A rinsed ITO substrate was placed in a vapor deposition unit, copper phthalocyanine as a hole injection material was first subjected to vapor deposition thereon in a thickness of 10 nm, and α-NPD (N,N'-diphenyl-N,N'-di(αnaphthyl)-benzidine) as a hole transport material was further subjected to vapor deposition thereon in a thickness of 40 nm. Thereafter, the foregoing Compound (1-2) and Compound c having the foregoing structure (light emitting material) were subjected to co-vapor deposition thereon at a ratio of 50/1 (by weight) in a thickness of 40 nm (light emitting layer), and Alq$_3$ was further subjected to vapor deposition thereon in a thickness of 20 nm (electron transport layer).

A patterned mask (a mask having a light emitting area of 4 mm×5 mm) was placed on this organic thin film, and lithium fluoride was subjected to vapor deposition thereon in a thickness of about 1 nm, and aluminum was further subjected to vapor deposition thereon in a thickness of about 200 nm within the vapor deposition unit, thereby preparing a device. The thus prepared EL device was made to undergo light emission and measured for luminance and light emission wavelength in the same manners as in Example 2.

As a result, organge-colored light emission having a chromaticity value (0.42, 0.54) was obtained, and the external quantum efficiency of the device was 1.6%.

When the device durability of this device is evaluated at an initial luminance of 2,000 cd/m$^2$ and at a constant current value, the half-time of luminance is about 2,000 hours.

Example 5

A device was prepared and evaluated in the same manners as in Example 4, except that Compound (1-1) and Compound Alq$_3$ were used in a weight ratio of 1/1 in place of the Compound (1-2). As a result, red light emission having a chromaticity value (0.43, 0.54) was obtained, and the external quantum efficiency of the device was 2.1%.

When the device durability of this device is evaluated at an initial luminance of 2,000 cd/m$^2$ and at a constant current value, the half-time of luminance is about 2,600 hours.

By using other compounds of the invention, light emitting devices with high efficiency could be also prepared in the same manner.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

This application is based on Japanese Patent Application No. JP2004-66780 filed on Mar. 10, 2004, the contents of which is incorporated herein by reference.

What is claimed is:

1. An organic electroluminescent device comprising:
a pair of electrodes; and
at least one organic layer between the pair of electrodes, the at least one organic layer including a light emitting layer,
wherein the light emitting layer comprises: a compound represented by formula (1); and a light emitting material:

L—(Ar$^1$)$_m$      Formula (1)

wherein Ar$^1$s each independently represents a group represented by formula (3); L is one of the following four structures:

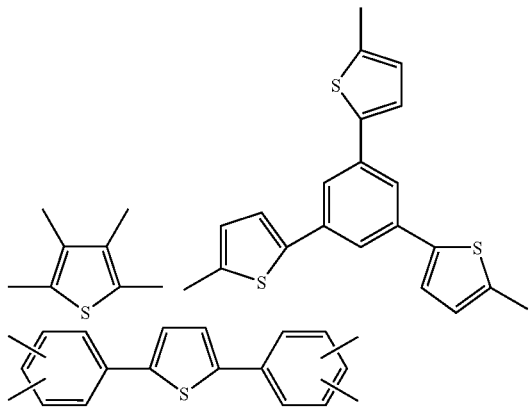

-continued

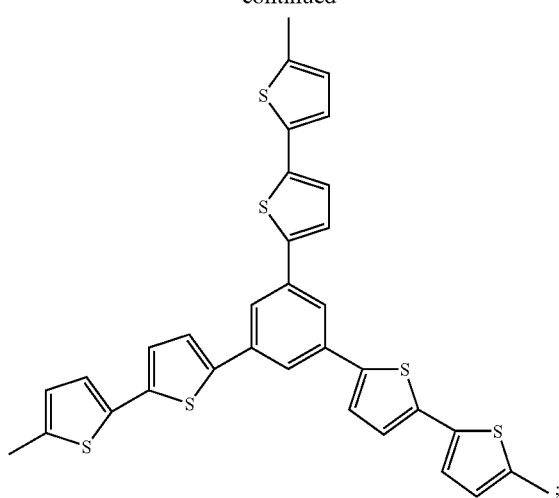

and m represents an integer of 3 or more:

Formula (3)

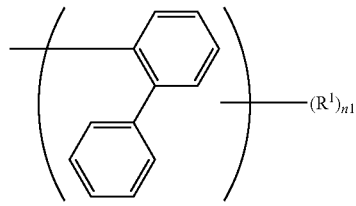

wherein R¹ represents a substituent and n1 is 0.

2. The organic electroluminescent device of claim 1, wherein the light emitting material comprises a phosphorescent material.

3. The organic electroluminescent device of claim 2, wherein the phosphorescent material is a transition metal complex.

4. The organic electroluminescent device of claim 1, wherein the light emitting layer further comprises a compound capable of at least one of injecting and transporting a hole.

5. The organic electroluminescent device of claim 4, wherein the compound capable of at least one of injecting and transporting the hole has an ionization potential of from 5.0 to 6.1 eV.

6. The organic electroluminescent device of claim 1, wherein the light emitting layer further comprises a compound capable of at least one of injecting and transporting an electron.

7. The organic electroluminescent device of claim 6, wherein the compound capable of at least one of injecting and transporting the electron has an electron affinity of from 2.0 to 3.5 eV.

8. The organic electroluminescent device of claim 6, wherein the compound capable of at least one of injecting and transporting the electron is a metal complex or a heterocyclic compound containing at least two nitrogen atoms.

9. The organic electroluminescent device of claim 1, wherein said light emitting layer emits red light.

* * * * *